United States Patent
Lee et al.

(10) Patent No.: US 8,492,974 B2
(45) Date of Patent: Jul. 23, 2013

(54) FLAT PANEL DISPLAY DEVICE AND METHOD OF MANUFACTURING THE SAME

(75) Inventors: Jae-Ho Lee, Yongin (KR); Dong-Won Han, Yongin (KR); Seung-Yong Song, Yongin (KR); Jin-Ho Kwack, Yongin (KR); Dae-Beom Shin, Yongin (KR); Dong-Hun Kang, Yongin (KR); Hyo-Jin Kim, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 0 days.

(21) Appl. No.: 13/240,760

(22) Filed: Sep. 22, 2011

(65) Prior Publication Data

US 2012/0133275 A1 May 31, 2012

(30) Foreign Application Priority Data

Nov. 26, 2010 (KR) .................. 10-2010-0118956

(51) Int. Cl.
 *H01J 1/62* (2006.01)
 *H01J 63/04* (2006.01)
 *H01J 9/26* (2006.01)

(52) U.S. Cl.
 USPC ............... 313/506; 313/512; 445/25

(58) Field of Classification Search
 USPC ................. 313/506, 512; 445/25
 See application file for complete search history.

(56) References Cited

U.S. PATENT DOCUMENTS

| 6,570,325 | B2 | 5/2003 | Graff et al. |
| 2005/0110404 | A1* | 5/2005 | Park et al. ............... 313/512 |
| 2005/0146266 | A1* | 7/2005 | Kuma et al. ............. 313/506 |
| 2006/0012300 | A1* | 1/2006 | Lan et al. ................ 313/512 |
| 2006/0082299 | A1 | 4/2006 | Yang |
| 2007/0040489 | A1* | 2/2007 | Ray et al. ............... 313/310 |
| 2007/0049155 | A1* | 3/2007 | Moro et al. .............. 445/24 |
| 2009/0153042 | A1 | 6/2009 | Izumi et al. |

FOREIGN PATENT DOCUMENTS

| JP | 2005209412 A | * | 8/2005 |
| JP | 2005335067 A | * | 12/2005 |
| JP | 2009-252574 A | | 10/2009 |
| KR | 10-2005-0052304 | | 6/2005 |
| KR | 10-2006-0034585 | | 4/2006 |
| KR | 1020090064320 A | | 6/2009 |

OTHER PUBLICATIONS

Nguyen Binh-Kheim et al., Polymer thin film deposited on liquid for varifocal encapsulated liquid lenses. Appl. Phys. Lett. 93, 124101 (2008); doi: 10.1063/1.2988467. (Online: http://dx.doi.org/10.1063/1.2988467).*

(Continued)

*Primary Examiner* — Anh Mai
*Assistant Examiner* — Michael Santonocito
(74) *Attorney, Agent, or Firm* — Robert E. Bushnell, Esq.

(57) ABSTRACT

In a flat panel display device and a method of manufacturing the same, the flat panel display device is manufactured by forming a display unit on a substrate, forming a hydrophobic barrier layer for preventing a material of an organic layer from flowing around the display unit, and forming a thin film sealing layer by alternately stacking an inorganic layer and the organic layer on the display unit. Accordingly, formation of an edge tail of the organic layer is prevented, thereby preventing penetration of external moisture.

13 Claims, 2 Drawing Sheets

OTHER PUBLICATIONS

Korean Office Action issued by Korean Patent Office on Feb. 22, 2012 in connection with Korean Patent Application No. 10-2010-0118956 and Request for Entry attached herewith.

Korean Office action issued by KIPO on Sep. 28, 2012 in connection with Korean Patent Application No. 10-2010-0118956 and Request for Entry attached herewith.

* cited by examiner

FLAT PANEL DISPLAY DEVICE AND METHOD OF MANUFACTURING THE SAME

CLAIM OF PRIORITY

This application makes reference to, incorporates the same herein, and claims all benefits accruing under 35 U.S.C. §119 from an application earlier filed in the Korean Intellectual Property Office on Nov. 26, 2010 and there duly assigned Serial No. 10-2010-0118956.

BACKGROUND OF THE INVENTION

1. Field of the Invention

The present invention relates to flat panel display devices and methods of manufacturing the same, and more particularly, to flat panel display devices which include an improved sealing structure for preventing penetration of external moisture.

2. Description of the Related Art

A flat panel display device, such as an organic light emitting display device, on which active research has been conducted, can be thin or flexible due to its driving characteristics.

However, when external oxygen or moisture penetrates into a display unit of an organic light emitting display device, the display unit of the organic light emitting display device may deteriorate. Thus, in order to prevent external oxygen or moisture from penetrating into the display unit, a sealing structure for sealing the display unit is required.

Typically, a thin film sealing structure is widely used as the sealing structure to cover a display unit by using a plurality of layers formed by alternately stacking an organic layer and an inorganic layer. That is, the display unit may be sealed by alternately stacking the organic layer and the inorganic layer on a substrate of the display unit.

In this case, the organic layer mainly makes a flat panel display device flexible, and the inorganic layer prevents external oxygen or moisture from penetrating into the flat panel display device. Thus, in order to prevent the external oxygen or moisture from penetrating into the flat panel display device, the organic layer is disposed on an inner portion adjacent to the display unit, and the inorganic layer is disposed outside the organic layer.

However, when the organic layer and the inorganic layer are stacked, the material of an edge portion of the organic layer flows outside the edge portion of the inorganic layer, which is referred to as an edge tail. In general, when the organic layer and the inorganic layer are formed, a mask corresponding to a layer is placed on a substrate so as to form a 1 pattern. In this case, the edge tail may be formed while the material of the organic layer flows between the mask and the substrate. Thus, the external oxygen or moisture may penetrate into the flat panel display unit through the edge tail, thereby deteriorating the performance of the flat panel display unit.

Thus, in order to obtain an efficient sealing structure for preventing the penetration of moisture or oxygen, there is a need for a method of preventing the formation of an edge tail of the organic layer.

SUMMARY OF THE INVENTION

The present invention provides flat panel display devices which includes an improved sealing structure for preventing an edge tail from forming.

According to an aspect of the present invention, a method of manufacturing a flat panel display device comprises: forming a display unit on a substrate; forming a hydrophobic barrier layer for preventing a material of an organic layer from flowing around the display unit; and forming a thin film sealing layer by alternately stacking an inorganic layer and the organic layer on the display unit.

The hydrophobic barrier layer may be formed on the substrate. The organic layer from among the inorganic layer and the organic layer may be formed to directly contact the display unit.

The hydrophobic barrier layer may be formed on the inorganic layer.

The inorganic layer may be formed so as to directly contact the display unit.

The hydrophobic barrier layer may be formed by using an inkjet printing method or a vacuum deposition method.

The material of the hydrophobic barrier layer may comprise a fluorine (F)-based material or a Teflon-based material.

The hydrophobic barrier layer may include a minute particle with a nanometer size.

The material of the organic layer may comprise polyurea or polyacrylate. The material of the inorganic layer may comprise $SiN_x$, $Al_2O_3$, $SiO_2$ or $TiO_2$.

According to another aspect of the present invention, a flat panel display device comprises: a substrate; a display unit formed on the substrate; a thin film sealing layer formed by alternately stacking an inorganic layer and an organic layer on the display portion; and a hydrophobic barrier layer formed around the display unit in order to prevent material of the organic layer from flowing.

The hydrophobic barrier layer may be formed on the substrate. The organic layer may be formed so as to directly contact the display unit.

The hydrophobic barrier layer may be formed on the inorganic layer. The inorganic layer may be formed so as to directly contact the display unit.

The material of the hydrophobic barrier layer may comprise a fluorine (F)-based material or a Teflon-based material.

The hydrophobic barrier layer may include a minute particle with a nanometer size.

The material of the organic layer may comprise polyurea or polyacrylate. The material of the inorganic layer may comprise $SiN_x$, $Al_2O_3$, $SiO_2$ or $TiO_2$.

According to the flat panel display device and the method of manufacturing the flat panel display device, formation of an edge tail of the organic layer is prevented, thereby preventing penetration of external moisture.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

The present invention will now be described more fully with reference to the accompanying drawings, in which exemplary embodiments of the invention are shown.

Figure 1:
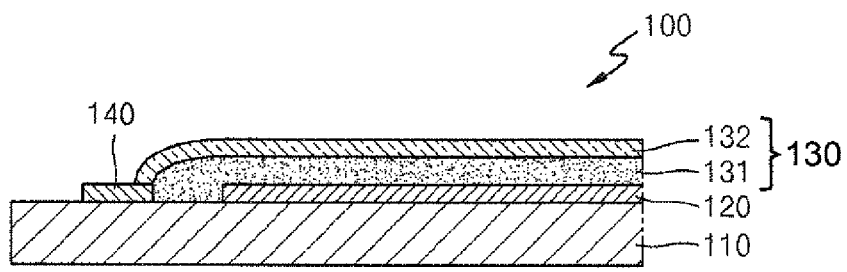
FIG. 1 is a cross-sectional view of a flat panel display device according to an embodiment of the present invention.

FIG. 1 is a cross-sectional view of a flat panel display device according to an embodiment of the present invention.

The flat panel display device 100 is configured in such a manner that a display unit 120 for forming an image is disposed on a substrate 110, and the display unit 120 is covered and protected by a thin film sealing layer 130.

The thin film sealing layer 130 includes an organic layer 131 directly covering the display unit 120, and an inorganic layer 132 covering the organic layer 131. The organic layer 131 mainly makes the flat panel display device 100 flexible, and the inorganic layer 132 prevents penetration of external oxygen or moisture.

The organic layer 131 may be formed of a flexible organic material, such as polyurea or polyacrylate.

The inorganic layer 132 may be formed of an inorganic material with excellent damp proofing performance, such as SiNx, $Al_2O_3$, $SiO_2$ or $TiO_2$.

A hydrophobic barrier layer 140, comprising a fluorine (F)-based material or a Teflon-based material, is formed around an edge of the substrate 110. The hydrophobic barrier layer 140 may be formed on the substrate 110 by using an inkjet printing method or a vacuum deposition method, and functions as a boundary portion for preventing a material of the organic layer 131 from flowing outward. That is, the organic layer 131 is blocked by the hydrophobic barrier layer 140 so as not to further extend outward, thereby forming a boundary portion. A method of manufacturing the flat panel display device 100 is described below in detail.

In addition, an entire portion of the organic layer 131 is covered by the inorganic layer 132, thereby preventing the penetration of external oxygen or moisture. That is, because the inorganic layer 132 covers the organic layer 131 up to an external boundary portion of the organic layer 131 such that a typical edge tail is not exposed to the outside, anti-permeability to moisture is remarkably improved.

FIGS. 2A thru 2D are cross-sectional views for describing a method of manufacturing the flat panel display device of FIG. 1 according to an embodiment of the present invention.

The flat panel display device 100 of FIG. 1 having the above-described structure may be manufactured as follows.

Figure 2A:
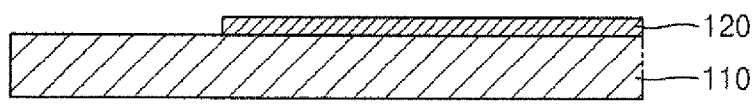
FIGS. 2A thru 2D are cross-sectional views for describing a method of manufacturing the flat panel display device of FIG. 1 according to an embodiment of the present invention.

First, as illustrated in FIG. 2A, the display unit 120 is formed on the substrate 110.

Figure 2B:
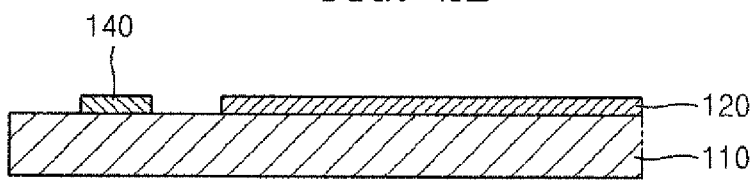

Then, as illustrated in FIG. 2B, the hydrophobic barrier layer 140 is formed outside the display unit 120 on the substrate 110. Thus, the hydrophobic barrier layer 140 is formed on a boundary portion of the organic layer 131. In this case, the hydrophobic barrier layer 140 may be formed by using a vacuum deposition method or an inkjet printing method.

In the vacuum deposition method, material of the hydrophobic barrier layer 140 is deposited on a target portion by using a mask in a vacuum chamber, and an F-based material or a Teflon-based material is deposited.

In the inkjet printing method, ink of F-based material or Teflon-based material is printed on the target portion so as to form the hydrophobic barrier layer 140.

The hydrophobic barrier layer 140 functions as a boundary portion for preventing the material of the organic layer 131, to be formed later, from flowing outward. That is, because hydrophobic material prevents fluid from flowing, the hydrophobic barrier layer 140 prevents the material of the organic layer 131 from flowing outward.

In addition, minute particles with a nanometer size may be included in the F-based material or the Teflon-based material. By the inclusion of a large amount of the minute particles with a nanometer size, a small droplet may not penetrate between the minute particles, and may float on the minute particles, thereby further preventing fluid from flowing outward.

Figure 2C:
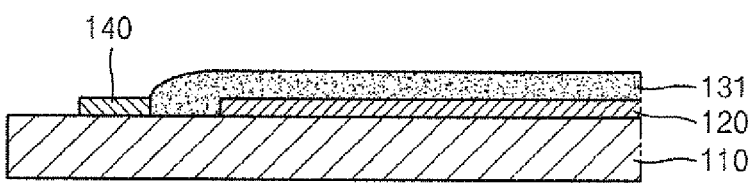

After the hydrophobic barrier layer 140 is formed, the organic layer 131 is formed, as illustrated in FIG. 2C. Because it is difficult to directly deposit a polymer, such as polyurea, polyacrylate or the like, which is a material of the organic layer 131, a liquid monomer is deposited, and then ultraviolet (UV) rays are irradiated on the liquid monomer so as to polymerize a polymer. In this case, since the hydrophobic barrier layer 140 functions as the boundary portion, the organic layer 131 is formed in a restricted manner within the boundary portion defined by the hydrophobic barrier layer 140.

Figure 2D:
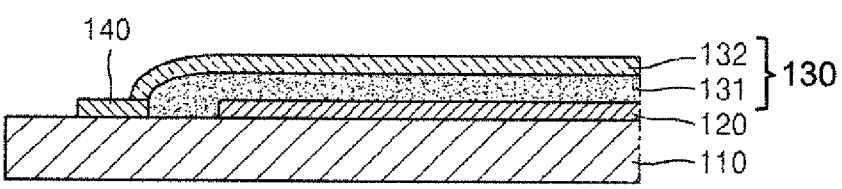

Then, as illustrated in FIG. 2D, the inorganic layer 132 is formed. The inorganic layer 132 is formed on the organic layer 131 by sputtering an inorganic material, such as SiNx, $Al_2O_3$, $SiO_2$ or $TiO_2$, and thus the inorganic layer 132 covers an entire portion of the organic layer 131.

Thus, because the organic layer 131 is covered by the inorganic layer 132 with excellent damp proofing performance, and because the organic layer 131 which is flexible but weak to moisture is not exposed to the outside, the thin film sealing layer 130 may have very stable anti-permeability to moisture.

In other words, after an external boundary portion of the organic layer 131 is correctly defined by the hydrophobic barrier layer 140, the organic layer 131 is covered by the inorganic layer 132, and thus formation of an edge tail may be prevented. Therefore, in this case, the display unit 120 will not deteriorate due to the penetration of oxygen or moisture.

If necessary, prior to forming the inorganic layer 132, the hydrophobic barrier layer 140 may be removed. However, even if the hydrophobic barrier layer 140 is not removed, the characteristics of the flat panel display device 100 are not affected. Thus, in consideration of process simplicity, the inorganic layer 132 may be formed but the hydrophobic barrier layer 140 may not be removed.

Figure 3:
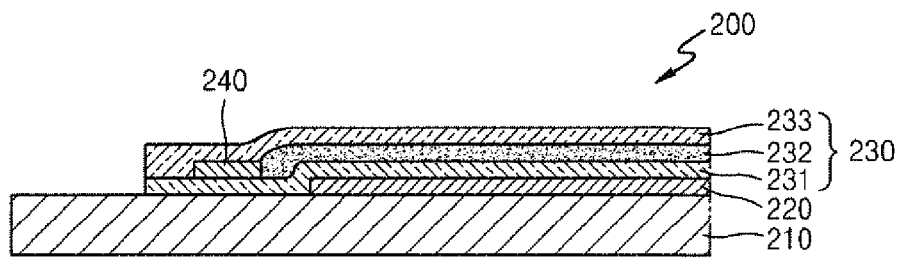
FIG. 3 is a cross-sectional view of a flat panel display device according to another embodiment of the present invention.

FIG. 3 is a cross-sectional view of a flat panel display device according to another embodiment of the present invention.

The flat panel display device 200 is configured in such a manner that a display unit 220 for forming an image is disposed on a substrate 210, and the display unit 220 is covered and protected by a thin film sealing layer 230.

The thin film sealing layer 230 includes a first inorganic layer 231 directly covering the display unit 220, an organic layer 232 formed on the first inorganic layer 231, and a second inorganic layer 233 covering the organic layer 232. The organic layer 232 mainly makes the flat panel display device 200 flexible, and the first and second inorganic layers 231 and 233, respectively, prevent penetration of external oxygen or moisture.

The organic layer 232 may be formed of a flexible organic material, such as polyurea or polyacrylate.

The first and second inorganic layers 231 and 233, respectively, may be formed of an inorganic material with excellent damp proofing performance, such as SiNx, $Al_2O_3$, $SiO_2$ or $TiO_2$.

A hydrophobic barrier layer 240 comprising a fluorine (F)-based material or a Teflon-based material is formed around an edge of the first inorganic layer 231. The hydrophobic barrier layer 240 may be formed on the first inorganic layer 231 by using an inkjet printing method or a vacuum deposition method, and functions as a boundary portion for preventing a material of the organic layer 232 from flowing outward. That is, the material of the organic layer 232 may be blocked by the hydrophobic barrier layer 240 so as not to flow outward, thereby forming a boundary portion. A method of manufacturing the flat panel display device 200 is described below in detail.

In addition, an entire portion of the organic layer 232 is covered by the second inorganic layer 233, thereby preventing the penetration of external oxygen or moisture. That is, the second inorganic layer 233 covers the organic layer 232 up to an external boundary portion of the organic layer 232 so that a typical edge tail is not exposed to the outside, thereby remarkably improving anti-permeability to moisture.

FIGS. 4A thru 4D are cross-sectional views for describing a method of manufacturing the flat panel display device of FIG. 3 according to another embodiment of the present invention.

The flat panel display device 200 of FIG. 3 having the above-described structure may be manufactured as follows.

Figure 4A:
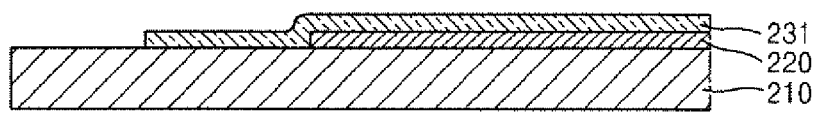
FIGS. 4A thru 4D are cross-sectional views for describing a method of manufacturing the flat panel display device of FIG. 3 according to another embodiment of the present invention.

First, as illustrated in FIG. 4A, the display unit 220 is formed on the substrate 210, and the first inorganic layer 231 is formed so as to cover the display unit 220. The first inorganic layer 231 may be formed by sputtering an inorganic material, such as SiNx, $Al_2O_3$, $SiO_2$ or $TiO_2$.

Figure 4B:
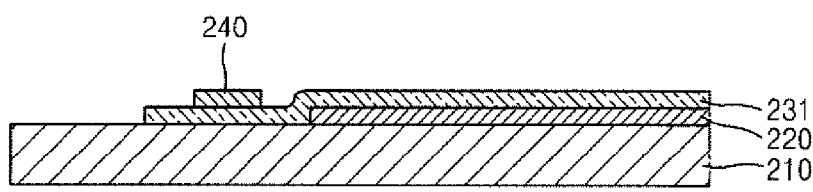

Then, as illustrated in FIG. 4B, the hydrophobic barrier layer 240 is formed on an edge portion of the first inorganic layer 231. The hydrophobic barrier layer 240 functions as a boundary portion of the organic layer 232 to be formed later. Thus, the hydrophobic barrier layer 240 is formed on a boundary portion of the organic layer 232. In this case, the hydrophobic barrier layer 240 may be formed by using a vacuum deposition method or an inkjet printing method.

In the vacuum deposition method, material of the hydrophobic barrier layer 240 is deposited on a target portion by using a mask in a vacuum chamber, and an F-based material or a Teflon-based material is deposited.

In the inkjet printing method, ink of F-based material or Teflon-based material is printed on the target portion so as to form the hydrophobic barrier layer 240.

The hydrophobic barrier layer 240 functions as a boundary portion for preventing the material of the organic layer 232, to be formed later, from flowing outward. That is, because hydrophobic material prevents fluid from flowing, the hydrophobic barrier layer 240 prevents the material of the organic layer 232 from flowing outward.

In addition, minute particles with a nanometer size may be included in the F-based material or the Teflon-based material. By the inclusion of a large amount of the minute particles with a nanometer size, a small droplet may not penetrate between the minute particles, and may float on the minute particles, thereby further preventing fluid from flowing outward.

Figure 4C:
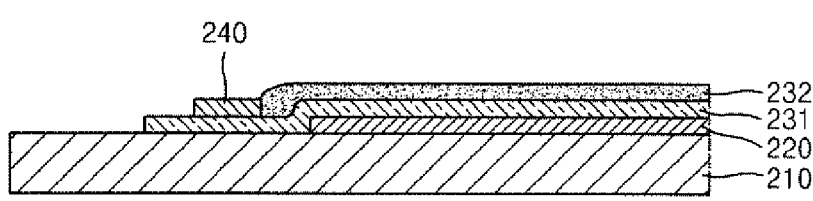

After the hydrophobic barrier layer 240 is formed, the organic layer 232 is formed, as illustrated in FIG. 4C. Because it is difficult to directly deposit a polymer, such as polyurea, polyacrylate or the like, which is a material of the organic layer 232, a liquid monomer is deposited, and then ultraviolet (UV) rays are irradiated on the liquid monomer so as to polymerize a polymer. In this case, because the hydrophobic barrier layer 240 functions as the boundary portion, the organic layer 232 is formed in a restricted manner within the boundary portion defined by the hydrophobic barrier layer 240.

Figure 4D:
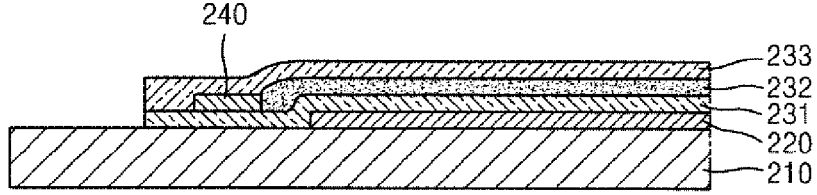

Then, as illustrated in FIG. 4D, the second inorganic layer 233 is formed. The second inorganic layer 233 is formed on the organic layer 232 by sputtering an inorganic material, such as SiNx, $Al_2O_3$, $SiO_2$ or $TiO_2$, and thus the second inorganic layer 233 covers an entire portion of the organic layer 232.

Thus, because the organic layer 232 is covered by the second inorganic layer 233 with excellent damp proofing performance, and because the organic layer 232 which is flexible but weak to moisture is not exposed to the outside, the thin film sealing layer 230 may have very stable anti-permeability to moisture.

In other words, after an external boundary portion of the organic layer 232 is correctly defined by the hydrophobic barrier layer 240, upper and lower portions of the organic layer 232 are surrounded by the first and second inorganic layers 231 and 233, respectively, and thus formation of an edge tail may be prevented. Therefore, the display unit 220 will not deteriorate due to the penetration of oxygen or moisture.

If necessary, prior to forming the second inorganic layer 233, the hydrophobic barrier layer 240 may be removed. However, even if the hydrophobic barrier layer 240 is not removed, the characteristics of the flat panel display device 200 are not affected. Thus, in consideration of process simplicity, the second inorganic layer 233 may be formed, but the hydrophobic barrier layer 240 may not be removed.

While the present invention has been particularly shown and described with reference to exemplary embodiments thereof, it will be understood by those of ordinary skill in the art that various changes in form and detail may be made therein without departing from the spirit and scope of the present invention as defined by the following claims.

What is claimed is:

1. A method of manufacturing a flat panel display device, the method comprising the steps of;
   forming a display unit on a substrate;
   forming an inorganic layer on the display unit, the inorganic layer being in direct contact with the display unit and extending to directly contact a portion of the substrate around the display unit;
   forming a hydrophobic barrier layer for preventing a material of an organic layer from flowing, the hydrophobic barrier layer being formed around the display unit and directly on the inorganic layer; and
   forming a thin film sealing layer by forming an organic layer on the inorganic layer.

2. The method of claim 1, wherein the hydrophobic barrier layer is formed by using one of an inkjet printing method and a vacuum deposition method.

3. The method of claim 1, wherein a material of the hydrophobic barrier layer comprises one of a fluorine (F)-based material and a Teflon-based material.

4. The method of claim 3, wherein the hydrophobic barrier layer comprises a minute particle with a nanometer size.

5. The method of claim 1, wherein a material of the organic layer comprises one of polyurea and polyacrylate.

6. The method of claim 1, wherein a material of the inorganic layer comprises one of SiNx, $Al_2O_3$, $SiO_2$ and $TiO_2$.

7. The method of claim 1, further comprising the step of forming a second inorganic layer on the organic layer.

8. A flat panel display device, comprising:
   a substrate;
   a display unit formed on the substrate;

an inorganic layer formed on the display unit, the inorganic layer being in direct contact with display and extending to directly contact a portion of the substrate around the display unit;

a thin film sealing layer formed by forming an organic layer on the inorganic layer; and a hydrophobic barrier layer formed around the display unit and directly on the inorganic layer for preventing a material of the organic layer from flowing.

9. The flat panel display device of claim 8, wherein a material of the hydrophobic barrier layer comprises one of a fluorine (F)-based material and a Teflon-based material.

10. The flat panel display device of claim 9, wherein the hydrophobic barrier layer comprises a minute particle with a nanometer size.

11. The flat panel display device of claim 8, wherein a material of the organic layer comprises one of polyurea and polyacrylate.

12. The flat panel display device of claim 8, wherein a material of the inorganic layer comprises one of $SiN_x$, $Al_2O_3$, $SiO_2$ and $TiO_2$.

13. The flat panel display device of claim 8, further comprising a second inorganic layer formed on the organic layer.

* * * * *